United States Patent
Dong

(10) Patent No.: US 7,521,320 B2
(45) Date of Patent: Apr. 21, 2009

(54) FLASH MEMORY DEVICE AND METHOD OF MANUFACTURING THE SAME

(75) Inventor: Cha Deok Dong, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/747,447

(22) Filed: May 11, 2007

(65) Prior Publication Data
US 2008/0029804 A1 Feb. 7, 2008

(30) Foreign Application Priority Data
Aug. 2, 2006 (KR) .............. 10-2006-0073047

(51) Int. Cl.
*H01L 21/336* (2006.01)

(52) U.S. Cl. .............. 438/257; 438/264; 438/424; 257/E21.002

(58) Field of Classification Search .............. 438/257, 438/264, 424, 435
See application file for complete search history.

(56) References Cited

U.S. PATENT DOCUMENTS

| | | | |
|---|---|---|---|
| 6,284,597 B1 * | 9/2001 | Hong | 438/257 |
| 6,459,121 B1 * | 10/2002 | Sakamoto et al. | 257/315 |
| 6,589,840 B2 * | 7/2003 | Tseng | 438/257 |
| 7,205,602 B2 * | 4/2007 | Hsieh | 257/315 |
| 7,214,596 B2 * | 5/2007 | Ciovacco et al. | 438/424 |
| 7,361,571 B2 * | 4/2008 | Nam | 438/424 |
| 2006/0051930 A1 * | 3/2006 | Lee et al. | 438/424 |

FOREIGN PATENT DOCUMENTS

| | | |
|---|---|---|
| JP | 2002-198446 | 7/2002 |
| KR | 10-2002-32396 | 5/2002 |
| KR | 2004-0001527 | 1/2004 |

* cited by examiner

*Primary Examiner*—N Drew Richards
*Assistant Examiner*—Christy L Novacek
(74) *Attorney, Agent, or Firm*—Marshall, Gerstein & Borun LLP

(57) ABSTRACT

A flash memory device and a method of manufacturing the same, the flash memory device includes isolation layers formed in an isolation region of a semiconductor substrate, an auxiliary oxide layer formed on edge portions of an active region of the semiconductor substrate and on protruded sidewalls of the isolation layers, a tunnel oxide layer formed on the auxiliary oxide layer of the edge portions of the active region and at a central portion of the active region, and a first polysilicon layer for a floating gate formed on the tunnel oxide layer.

16 Claims, 7 Drawing Sheets

FLASH MEMORY DEVICE AND METHOD OF MANUFACTURING THE SAME

CROSS-REFERENCES TO RELATED APPLICATION

The priority of Korean patent application number 10-2006-73047, filed on Aug. 2, 2006, which is incorporated by reference in its entirety, is claimed.

BACKGROUND OF THE INVENTION

The invention relates, in general, to flash memory devices and, more particularly, to a flash memory device and a method of manufacturing the same, in which degradation of the characteristics of a tunnel oxide layer can be prevented.

As the level of integration of semiconductor devices increases, it becomes difficult to align floating gates and isolation layers in the process of manufacturing a flash memory device. Thus, the floating gates are aligned using a Self Aligned Floating Gate (SAFG) process. The SAFG process is a process of forming a polysilicon layer for a floating gate in a semiconductor substrate, using an etch process to sequentially etch the polysilicon layer and the semiconductor substrate, thus forming trenches, and burying the trenches with insulating material, thus patterning the polysilicon layer while forming isolation layers.

In the existing method, however, at the time of the process of forming the tunnel oxide layer, the thickness at the top corners of the tunnel oxide layer, which is formed in the active region, becomes thinner than that at the central portion of the tunnel oxide layer. This phenomenon causes degradation in the characteristics of the tunnel oxide layer, and affecting the characteristics of a program/erase cycle.

SUMMARY OF THE INVENTION

Accordingly, the invention addresses the above problems, and provides a flash memory device and a method of manufacturing the same, in which additional oxide layers are formed at both edge portions of an active region, and a tunnel oxide layer and a floating gate are then formed, so that the edge portions of the tunnel oxide layer become thicker than the central portion of the tunnel oxide layer due to a re-growth effect in the process of forming a subsequent tunnel oxide layer, thus improving the characteristics of the device.

In one aspect of the invention, a flash memory device includes isolation layers formed in an isolation region of a semiconductor substrate, an auxiliary oxide layer formed on edge portions of an active region of the semiconductor substrate and on protruded sidewalls of the isolation layers, a tunnel oxide layer formed on the auxiliary oxide layer of the edge portions of the active region and at a central portion of the active region, and a first poly silicon layer for a floating gate formed on the tunnel oxide layer.

In another aspect of the invention, a method of manufacturing a flash memory device includes the steps of forming trenches in an isolation region on a semiconductor substrate, and burying the trenches to form protruded isolation layers on the semiconductor substrate, forming an auxiliary oxide layer only on sidewalls of the isolation layers and on edge portions of an active region of the semiconductor substrate, forming a tunnel oxide layer in the active region of the semiconductor substrate including the auxiliary oxide layer, and forming a polysilicon layer for a floating gate on the tunnel oxide layer.

DESCRIPTION OF SPECIFIC EMBODIMENTS

A specific embodiment according to the invention is described below with reference to the accompanying drawings.

FIGS. 1 to 13 are cross-sectional views illustrating a method of manufacturing a flash memory device according to an embodiment of the invention.

Figure 1:
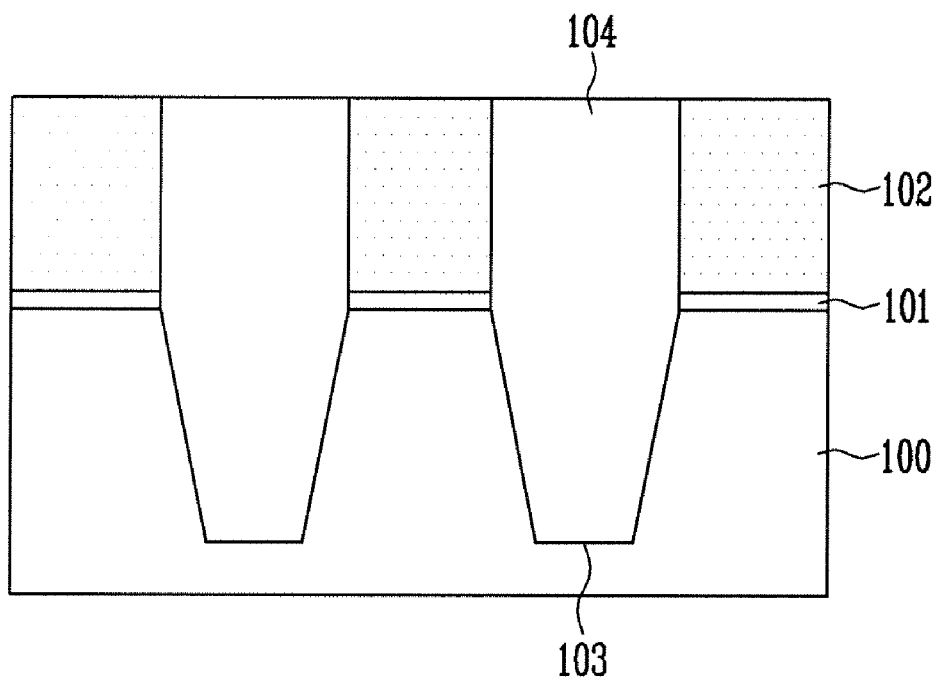
FIGS. 1 to 13 are cross-sectional views illustrating a method of manufacturing a flash memory device according to an embodiment of the invention.

Referring to FIG. 1, a screen oxide layer 101 for controlling the threshold voltage Vt are formed over a semiconductor substrate 100. Ions for controlling various wells and the threshold voltage Vt are implanted. A nitride layer 102 for forming an isolation layer and a hard mask (not illustrated) are sequentially deposited. An etch process for forming the isolation layer is performed to sequentially etch the nitride layer 102 and the screen oxide layer 101, exposing a given region of the semiconductor substrate 100, that is, a region in which the isolation layer will be formed. The exposed semiconductor substrate 100 is etched to a specific depth, forming trenches 103. Though not illustrated in the drawings, a liner oxide layer of 20 angstroms to 150 angstroms in thickness can be formed on the sidewall and bottom of each trench 103, preferably by means of a dry or wet oxidization method or radical ions. Thereafter, insulating material is formed on the entire surface in such a way to bury the trenches 103. A Chemical Mechanical Polishing (CMP) process is performed until the nitride layer 102 is exposed, forming isolation layers 104.

Figure 2:
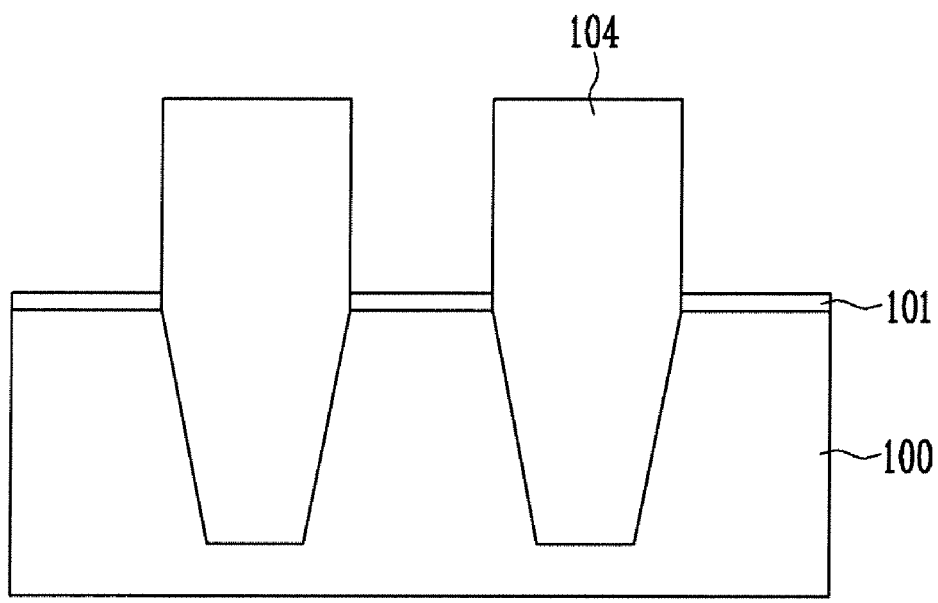

Referring to FIG. 2, a cleaning process for removing the oxide layer that may remain on the nitride layer 102 is performed. The cleaning process is preferably performed using Buffered Oxide Etchant (BOE) or HF solution. Thereafter, the nitride layer 102 is removed by performing an etch process preferably employing $H_3PO_4$. In this case, the etch process can be performed simultaneously with the cleaning process.

Figure 3:
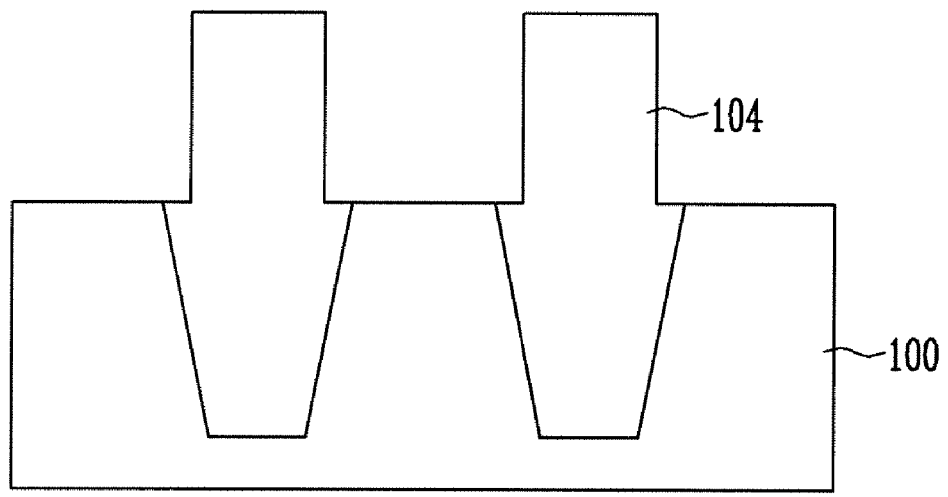

Referring to FIG. 3, the screen oxide layer 101 is removed by performing a cleaning process, reducing the protruded portions of the isolation layers 104, that is, the widths of nipples.

Figure 4:
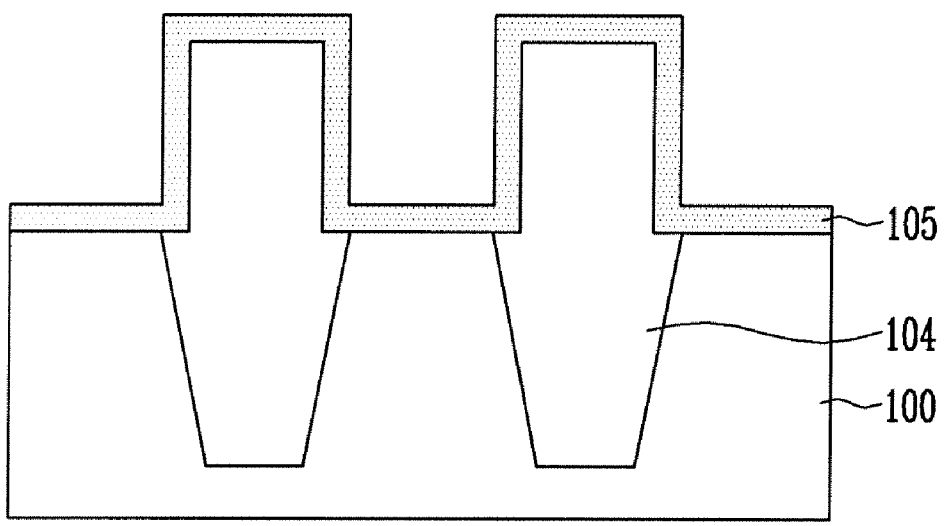

Referring to FIG. 4, an auxiliary oxide layer 105 is formed on the entire surface. The auxiliary oxide layer 105 is preferably formed by a Low Pressure Chemical Vapor Deposition (LP-CVD) method. Furthermore, the auxiliary oxide layer 105 is preferably formed from DCS-based HTO, TEOS, or MS-based oxide to a thickness of about 50 angstroms to 150 angstroms.

Figure 5:
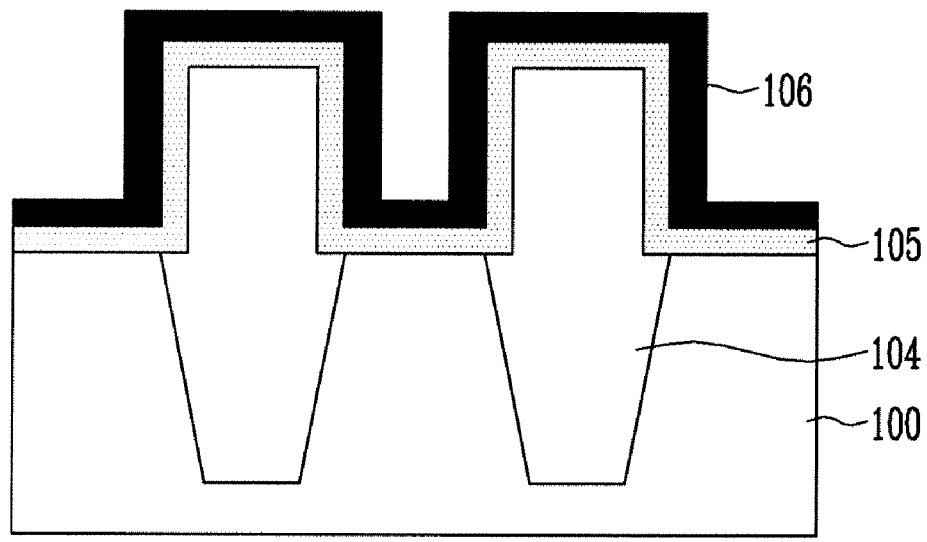

Referring to FIG. 5, a spacer nitride layer 106 is formed on the entire surface including the auxiliary oxide layer 105. The spacer nitride layer 106 is preferably formed by a LP-CVD method. Furthermore, the spacer nitride layer 106 is preferably deposited to a thickness of 50 angstroms to 200 angstroms.

Figure 6:
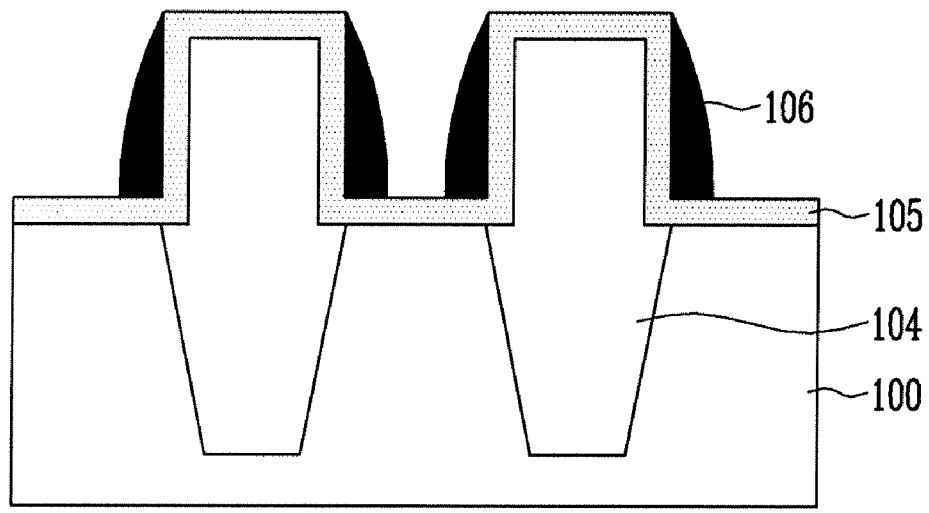

Referring to FIG. 6, a partial etch process is performed such that the spacer nitride layer 106 remains only on the sidewalls of the nipples of the isolation layers 104 and the edge region of the active region. The spacer nitride layer 106 is preferably formed to have a width of about 50 angstroms to 150 angstroms. In this case, the etch process can be carried out by using an etchant having a high etch selectivity against the oxide layer in order to minimize the loss of the auxiliary oxide layer 105.

Figure 7:
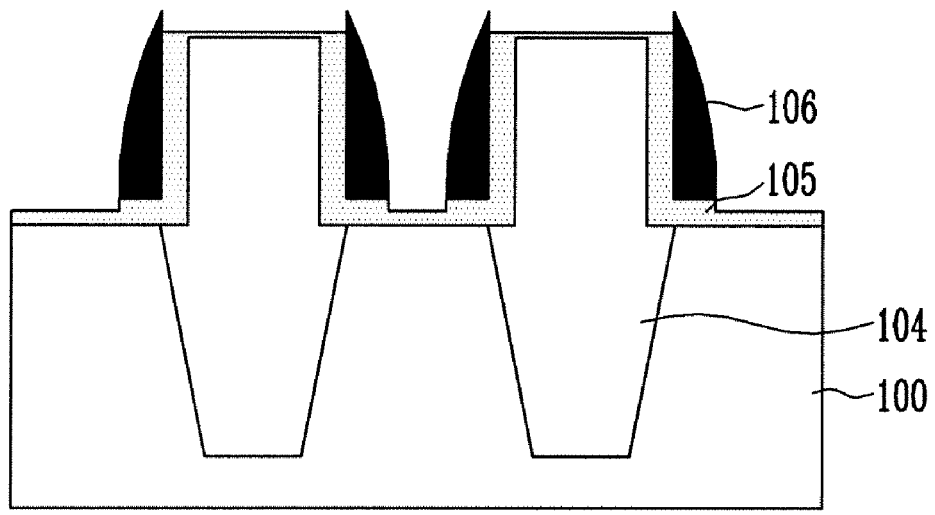

Referring to FIG. 7, the exposed auxiliary oxide layer 105 is etched by performing all etch process so that the auxiliary oxide layer 105 of a specific thickness remains in the active region. This is for the purpose of preventing damage to the active region in a subsequent process for removing the spacer nitride layer 106.

Figure 8:
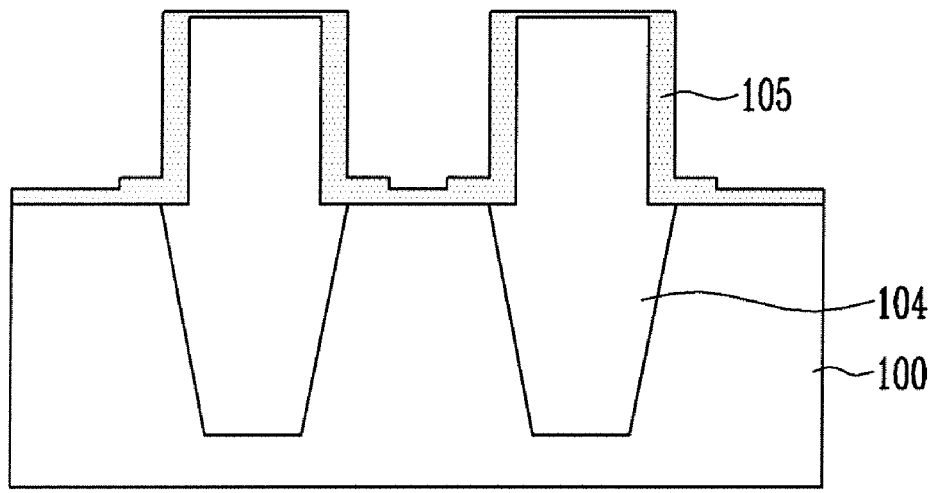

Referring to FIG. 8, the spacer nitride layer 106 is removed by performing an etch process. The etch process is preferably performed using $H_3PO_4$.

Figure 9:
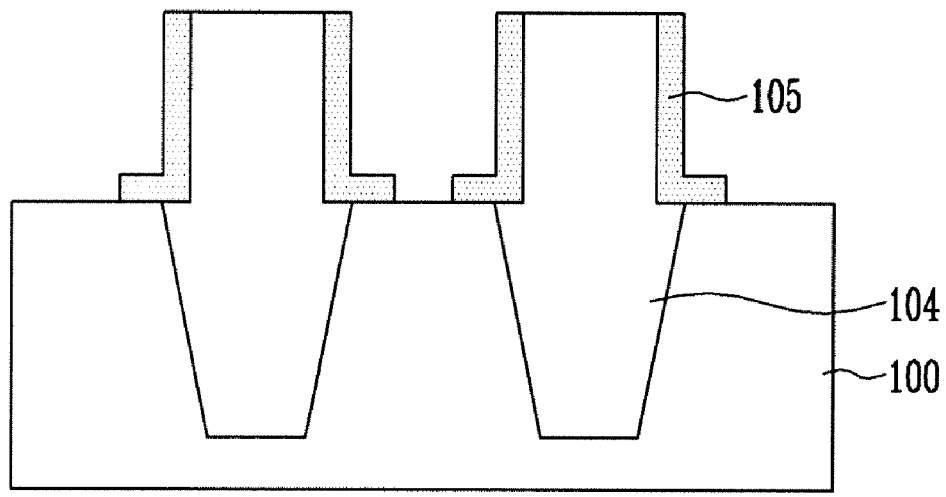

Referring to FIG. 9, the auxiliary oxide layer 105, remaining on the top surfaces of the isolation layers 104 and at the central region of the active region, is removed by performing a pre-treatment cleaning process. At this time, the thickness of the auxiliary oxide layer remaining in the edge region of the active region can be controlled by controlling an etch process time.

Figure 10:
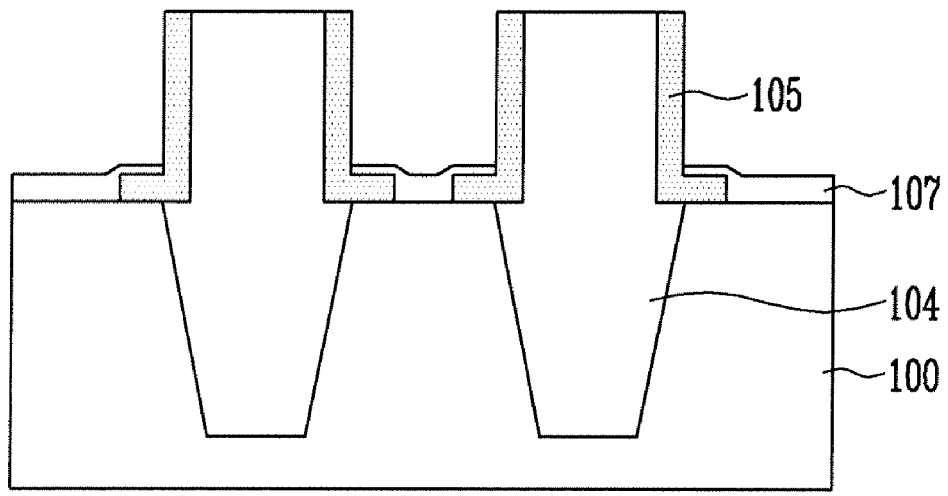

Referring to FIG. 10, a tunnel oxide layer 107 is formed on the active region of the semiconductor substrate 100. The tunnel oxide layer 107 can be formed by performing a wet or dry oxidization process, or a radical oxidization process employing radical ions. The thickness of the edge region (the sum of the thickness of the tunnel oxide layer 107 and the thickness of the auxiliary oxide layer 105) becomes thicker than that of the central region (the thickness of the tunnel oxide layer 107) due to the thickness of the auxiliary oxide layer 105 remaining in the edge region of the tunnel oxide layer 107. For example, the thickness of the edge region can be 10% to 30% thicker than that of the central region. Accordingly, degradation in the characteristics of the tunnel oxide layer, resulting in a thinned edge region or the tunnel oxide layer in the prior art, can be prevented. Consequently, the program/erase characteristic can be improved, the density of interface traps can be decreased, and threshold voltage shift and electrical characteristics can be improved.

Figure 11:
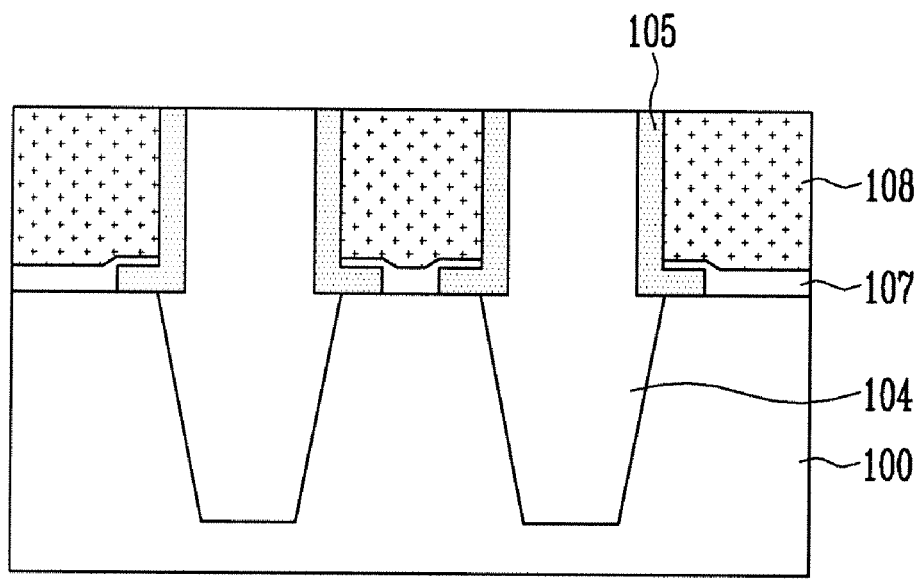

Referring to FIG. 11, a first polysilicon layer 108 for a floating gate is formed on the entire surface including the tunnel oxide layer 107. Preferably, a CMP process is then performed to expose the top surfaces of the isolation layers 104.

Figure 12:
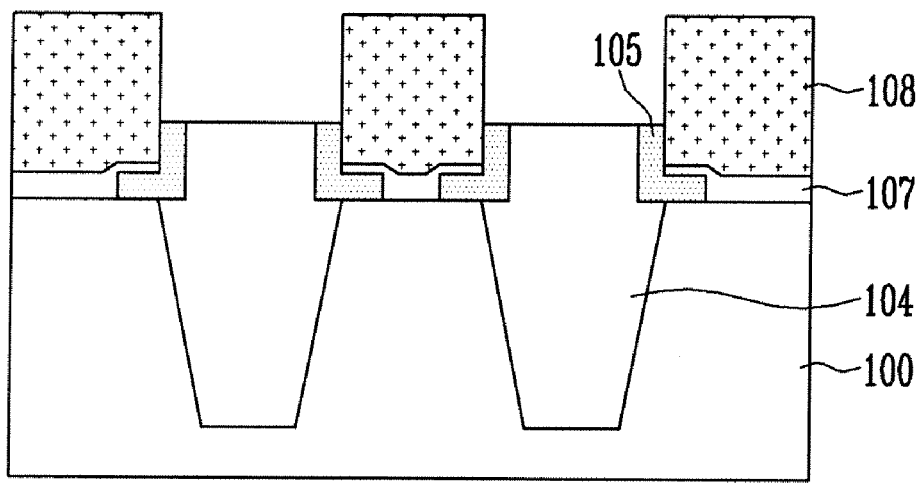

Referring to FIG. 12, the nipples of the exposed isolation layers 104 and the auxiliary oxide layer 105 are etched to a specific thickness by performing an etch process. This is for the purpose of increasing the surface area of a subsequent dielectric layer. In other words this is for the purpose of increasing the coupling ratio by increasing the surface area of the dielectric layer.

Figure 13:
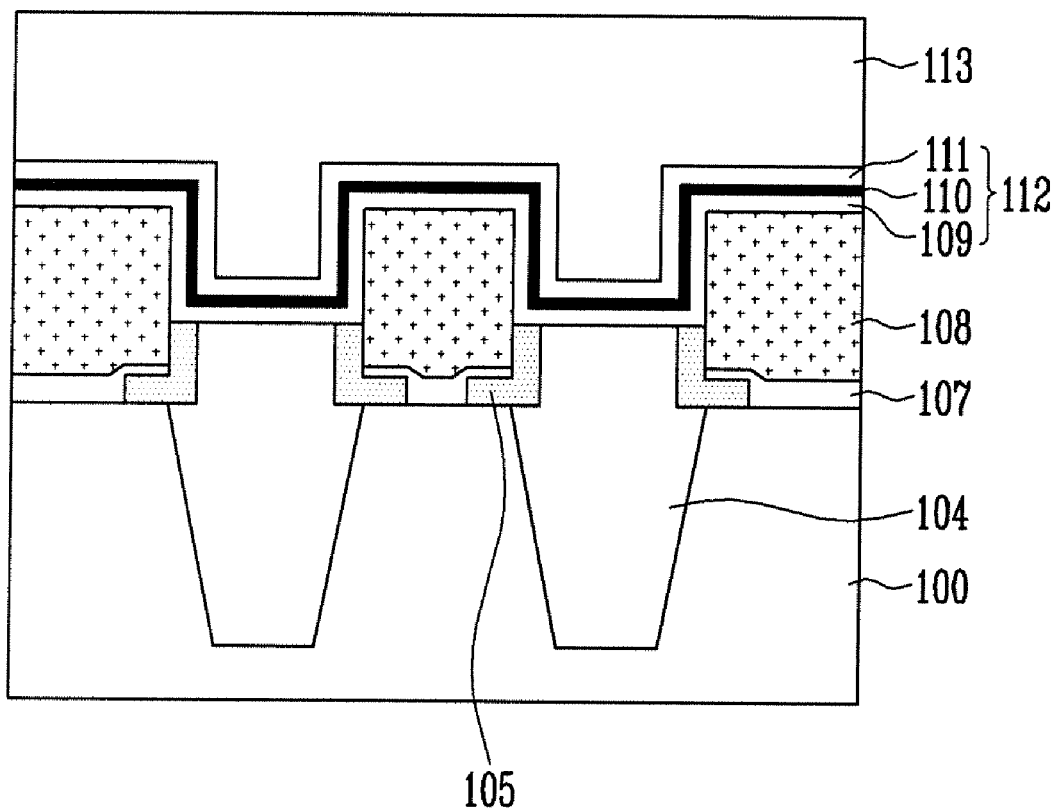

Referring to FIG. 13, a dielectric layer 112 having an ONO structure in which a first oxide layer 109, a nitride layer 110, and a second oxide layer 111 are sequentially laminated is deposited on the entire surface. A second polysilicon layer 113 for a control gate is deposited on the entire surface including the dielectric layer 112.

As described above, according to the invention, additional oxide layers are formed at the edge portions of the active region, and the tunnel oxide layer and the floating gate are then formed. Thus, the edge portions of the tunnel oxide layer become thicker than the central portion of the tunnel oxide layer due to the re-growth effect in the process of forming a subsequent tunnel oxide layer. Accordingly, the characteristics of the device can be improved.

Although the foregoing description has been made with reference to a specific embodiment changes and modifications of the present patent may be made by a person of ordinary skill in the art without departing from the spirit and scope of the invention.

What is claimed is:

1. A method of manufacturing a flash memory device, comprising:
   forming trenches in an isolation region on a semiconductor substrate, and burying the trenches to form protruded isolation layers on the semiconductor substrate;
   forming an auxiliary oxide layer only on sidewalls of the isolation layers and on edge portions of an active region of the semiconductor substrate so that the auxiliary oxide layer is formed in the form of an 'L';
   forming a tunnel oxide layer on the active region of the semiconductor substrate and on the auxiliary oxide layer; and
   forming a polysilicon layer for a floating gate on the tunnel oxide layer and over the auxiliary oxide layer.

2. The method of claim 1, wherein the forming the isolation layers comprises:
   sequentially forming a screen oxide layer, a nitride layer, and a hard mask on a semiconductor substrate;
   etching the nitride layer, the screen oxide layer, and the semiconductor substrate by an etch process employing a hard mask, forming the trenches;
   performing an oxidization process to form a liner oxide layer on sidewalls and bottom surfaces of the trenches;
   forming an insulating layer on the entire surface including the trenches, and then exposing the nitride layer by performing a Chemical Mechanical Polishing (CMP) process; and
   sequentially removing the nitride layer and the screen oxide layer.

3. The method of claim 2, comprising forming the liner oxide layer to a thickness of 20 angstroms to 150 angstroms by a dry or wet oxidization method, or by employing radical ions.

4. The method of claim 2, wherein removing the nitride layer comprises:
   performing a cleaning process using Buffered Oxide Etchant (BOE) or HF solution in order to remove the oxide layer remaining on the nitride layer; and
   performing an etch process using $H_3PO_4$ to remove the nitride layer.

5. The method of claim 2, wherein removing the screen oxide layer comprises decreasing widths of the protruded isolation layers while removing the screen oxide layer.

6. The method of claim 1, comprising forming the auxiliary oxide layer by a Low Pressure Chemical Vapor Deposition (LP-CVD) method.

7. The method of claim 1, comprising forming the auxiliary oxide layer from DCS-based HTO, TEOS, or MS-based oxide to a thickness of 50 angstroms to 150 angstroms.

8. The method of claim 1, wherein forming the auxiliary oxide layer comprises:
   forming the auxiliary oxide layer on the entire surface including the isolation layers;
   forming a spacer nitride layer on the entire surface including the auxiliary oxide layer;
   performing a partial etch process to make the spacer nitride layer remaining only on a sidewall region of the isolation layers and an edge region of the active region;

removing the exposed auxiliary oxide layer; and removing the remaining spacer nitride layer.

9. The method of claim 8, comprising depositing the spacer nitride layer to a thickness of 50 angstroms to 200 angstroms by a Low Pressure Chemical Vapor Deposition (LP-CVD) method.

10. The method of claim 8, wherein the remaining spacer nitride layer has a width of 50 angstroms to 150 angstroms.

11. The method of claim 8, wherein removing the exposed auxiliary oxide layer comprises controlling an etch time in order to make the auxiliary oxide layer on the central portion of the active region remaining to a specific thickness, preventing damage to the active region in a process of removing the spacer nitride layer.

12. The method of claim 11, further comprising performing a cleaning process to remove the auxiliary oxide layer on the central portion of the remaining active region after removing the spacer nitride layer.

13. The method of claim 12, wherein the cleaning process comprises controlling the thickness of the auxiliary oxide layer remaining at the edge region of the active region by controlling a process time.

14. The method of claim 1, comprising forming the tunnel oxide layer by performing a wet or dry oxidization process, or a radical oxidization method employing radical ions.

15. The method of claim 1, wherein a sum of a thickness of the tunnel oxide layer formed on the edge portions of the active region and a thickness of the auxiliary oxide layer is 10% to 30% thicker than that of the tunnel oxide layer formed at the central portion of the active region of the semiconductor substrate.

16. The method of claim 1, further comprising sequentially forming a dielectric layer, and a polysilicon layer for a control gate on the entire surface including the polysilicon layer for a floating gate.

* * * * *